(12) United States Patent
Lin et al.

(10) Patent No.: US 12,471,236 B2
(45) Date of Patent: *Nov. 11, 2025

(54) LOCKING DEVICE, AND CHASSIS WITH THE LOCKING DEVICE

(71) Applicant: Fulian Precision Electronics (Tianjin) Co., LTD., Tianjin (CN)

(72) Inventors: Chieh-Hsiang Lin, New Taipei (TW); Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 212 days.

This patent is subject to a terminal disclaimer.

(21) Appl. No.: 18/327,075

(22) Filed: Jun. 1, 2023

(65) Prior Publication Data

US 2024/0407124 A1 Dec. 5, 2024

(30) Foreign Application Priority Data

Jun. 28, 2022 (CN) .......................... 202210754199.1

(51) Int. Cl.
*H05K 7/14* (2006.01)
*H05K 5/02* (2006.01)

(52) U.S. Cl.
CPC ......... *H05K 7/1489* (2013.01); *H05K 5/0217* (2013.01); *H05K 5/0221* (2013.01);
(Continued)

(58) Field of Classification Search
CPC .. H05K 7/1401; H05K 7/1402; H05K 7/1404; H05K 7/1405; H05K 7/1407; H05K 7/1408; H05K 7/1409; H05K 7/1411; H05K 7/1415; H05K 7/1421; H05K 7/1487; H05K 7/1489; H05K 5/0217; H05K 5/0221;
(Continued)

(56) References Cited

U.S. PATENT DOCUMENTS

| 8,096,627 B2 * | 1/2012 | Lin ...................... E05B 65/006 312/325 |
| 8,534,777 B2 * | 9/2013 | Gong ...................... G06F 1/187 361/679.33 |

(Continued)

FOREIGN PATENT DOCUMENTS

TW I528886 B 4/2016

*Primary Examiner* — Allen L Parker
*Assistant Examiner* — Gage Crum
(74) *Attorney, Agent, or Firm* — ScienBiziP, P.C.

(57) ABSTRACT

A locking device and a chassis comprise a blocking element, a fixing element, an operating element and a locking component; the blocking element is configured to be installed on the first component; the fixing element is configured to be installed on the second component; the operating element is movably arranged on the fixing element, and defining a chute; the locking component comprises a connection element, a locking element and a link module; the connection element is movably connected within the chute; the locking element is rotationally arranged at the fixing element; the link module comprises at least two rotationally connected connecting link members, the link module is rotationally connected to the connection element; one end of the link module is rotationally connected to the fixing element, while another is rotationally connected to the locking element.

20 Claims, 8 Drawing Sheets

(52) U.S. Cl.
CPC ......... *H05K 7/1401* (2013.01); *H05K 7/1402* (2013.01); *H05K 7/1487* (2013.01)

(58) Field of Classification Search
CPC .... H05K 5/023; G11B 33/123; G11B 33/124; G06F 1/1679; G06F 1/181; G06F 1/184; G06F 1/185; G06F 1/186; G06F 1/187; A47B 88/423; A47B 2088/4235; A47B 88/427; A47B 2088/4276; A47B 88/43; A47B 88/49; A47B 88/483; A47B 88/497; E05B 65/04; F16B 2/185
USPC ...................................................... 361/679.02
See application file for complete search history.

(56) References Cited

U.S. PATENT DOCUMENTS

| | | | |
|---|---|---|---|
| 9,107,321 B2* | 8/2015 | Yin | H05K 7/1489 |
| 9,521,774 B2* | 12/2016 | Liang | H05K 7/1415 |
| 9,930,804 B2* | 3/2018 | Lu | H05K 7/1489 |
| 10,368,460 B1* | 7/2019 | Yang | H05K 7/1411 |
| 10,827,641 B1* | 11/2020 | Shen | H05K 7/20709 |
| 10,939,574 B2* | 3/2021 | Wu | H05K 7/1489 |
| 11,026,342 B2* | 6/2021 | Huang | H05K 7/1487 |
| 11,160,189 B2* | 10/2021 | Yu | H05K 7/183 |
| 2009/0218825 A1* | 9/2009 | Chiang | G06F 1/183 |
| | | | 292/140 |
| 2013/0162131 A1* | 6/2013 | Zhou | G06F 1/187 |
| | | | 312/304 |
| 2017/0135473 A1* | 5/2017 | Chen | A47B 88/483 |
| 2023/0417092 A1* | 12/2023 | Lin | G06F 1/187 |

\* cited by examiner

LOCKING DEVICE, AND CHASSIS WITH THE LOCKING DEVICE

FIELD

The subject matter herein generally relates to a detachable connection structure, in particular to a locking device and a chassis with the locking device.

BACKGROUND

The rapid development of the information technology facilitates the development of the data storage technology and the computing technology in a computer device (e.g., a computer or a server), and a usage requirement is continuously increased accordingly. For a computer device, on the one hand, it is required that components (e.g., a hard disk or a mainboard module) in various computers be easy to be installed and disassembled. On the other hand, the components in the computer are required to effectively satisfy the hot-plugging (Hot-plugging or Hot Swap) function. Thus, a computer needs to have a device convenient for quick installation and removal while satisfying the hot-plugging function, so as to adapt to the development and application requirements that is continuously updated.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
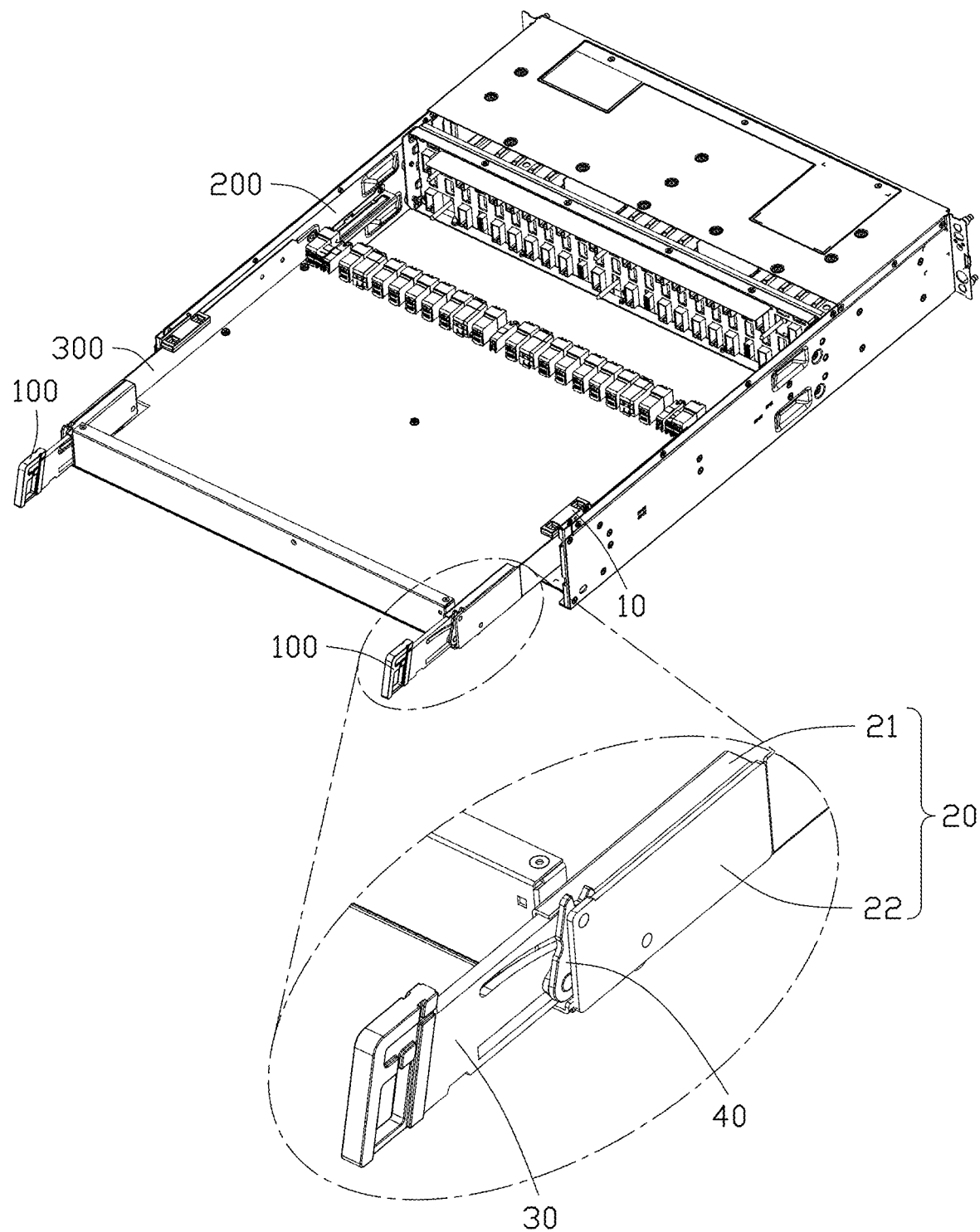
FIG. 1 is an isometric view of a chassis, the chassis including a first component, a second component and the locking device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, an embodiment of the present application provides a locking device 100 for detachably locking a second component 300 onto a first component 200. The locking device 100 includes a blocking element 10, a fixing element 20, an operating element 30, and a locking component 40. The blocking element 10 is arranged on the first component 200 to block the locking component 40. The fixing element 20 is arranged on the second component 300. The operating element 30 is located on the fixing element 20 and is movably relative to the fixing element 20. The locking component 40 is arranged between the fixing element 20 and the operating element 30. The locking component 40 and the operating element 30 are connected. There is relative motion between the locking component 40 and the operating element 30. The operating element 30 is configured to drive the locking component 40 to engage with the blocking element 10 to install the fixing element 20 and the second component 300 in the first component 200.

The operating element 30 is configured to drive the locking component 40 to move. the locking component 40 is cooperated with the blocking element 10, and the fixing element 20 is locked or detached from the first component 200. Then the second component 300 is locked or detached from the first component 200.

In an embodiment, the first component 200 maybe, such as a computer chassis, a desk, and so on. The second component 300 is a data storage device that matches the computer chassis, or a drawer that matches the desk.

In an embodiment, one end of the first component 200 is provided with an opening, and the second component 300 passes through the opening and enters the interior of the first component 200.

For clarity in the subsequent description, a direction of detachment is defined as the reverse direction of the locking component 40 moving towards the blocking element 10, and the direction of detachment is parallel to the direction of the second component 300 exiting the first component 200. The subsequent "back end" refers to the back end of the structure along the direction of detachment, while the subsequent "front end" refers to the front end of the structure along the direction of detachment.

The blocking element 10 is connected to the first component 200. The fixing element 20 is connected to the back end of the second component 300. When the second component 300 is locked to the first component 200, the blocking element 10 prevents the movement of the fixing element 20 by blocking the movement of the locking component 40.

Figure 2:
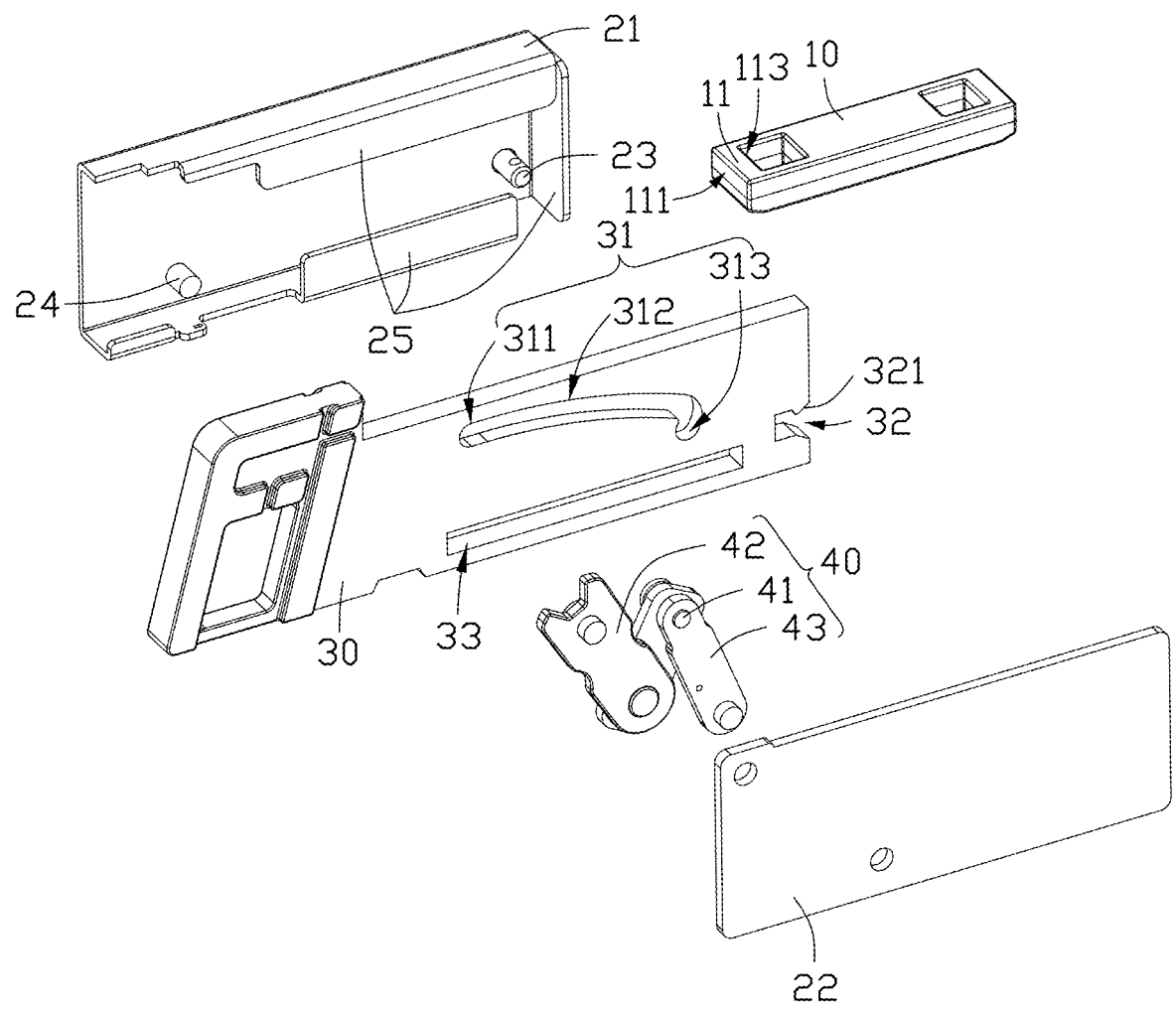
FIG. 2 is an isometric, exploded view of the locking device shown in FIG. 1.

As shown in FIG. 2, the fixing element 20 includes a first part 21 and a second part 22. The operating element 30 is installed on the first part 21. The locking component 40 is installed on the second part 22. The operating element 30 and the locking component 40 are located between the first part 21 and the second part 22. The first part 21 is detachably connected to the second part 22 for easy disassembly and assembly of fixing element 30 and locking component 40. The second part 22 is detachably installed on the second component 300 for easy disassembly and assembly of the fixing element 20 and second component 300.

In an embodiment, the first part 21 and second part 22 are connected by bolts or buckles, and the fixing element 20 and second component 300 are connected by bolts or buckles.

In an embodiment, the first part 21 is fixedly connected to the second part 22, and the fixing element 20 is fixedly connected to the second component 300.

In an embodiment, the fixing element 20 is made of materials such as metal and hard plastic.

The blocking element 10 is set in other positions of the first component 200, and fixing element 20 is set in other positions of the second component 300. Moreover, when the second component 300 is locked at the first component 200, the blocking element 10 limits the movement of the fixing element 20 through the locking component 40.

As shown in FIG. 2, a chute 31 is defined in the operating element 30. The chute 31 is located in the middle of the operating element 30. The chute 31 is configured for accommodating a partial structure of the locking component 40 and allowing the partial structure of the locking component 40 to move within the chute 31, in order to move the operating element 30 relative to the locking component 40.

As shown in FIG. 2, the locking component 40 includes a connection element 41, a locking element 42, and a link module 43. The connection element 41 is located in the chute 31. The locking element 42 is set on the fixing element 20 and rotates relative to the fixing element 20. The connection element 41 and the link module 43 are rotationally connected. One end of the link module 43 is rotationally installed on the fixing element 20, and the other end of the link module 43 is rotationally connected to the locking element 42. During the movement of operating element 30, the locking element 42 rotates under the action of the blocking element 10 and the connection element 41. The connection element 41 is configured to move within the chute 31. The link module 43 rotates under the drive of the connection element 41 and drives the locking element 42 to rotate within the preset range.

In an embodiment, the connection element 41 is a rod-shaped structure. In another embodiment, the connection element 41 is a columnar structure or other structures that achieves connection functions.

Figure 3:
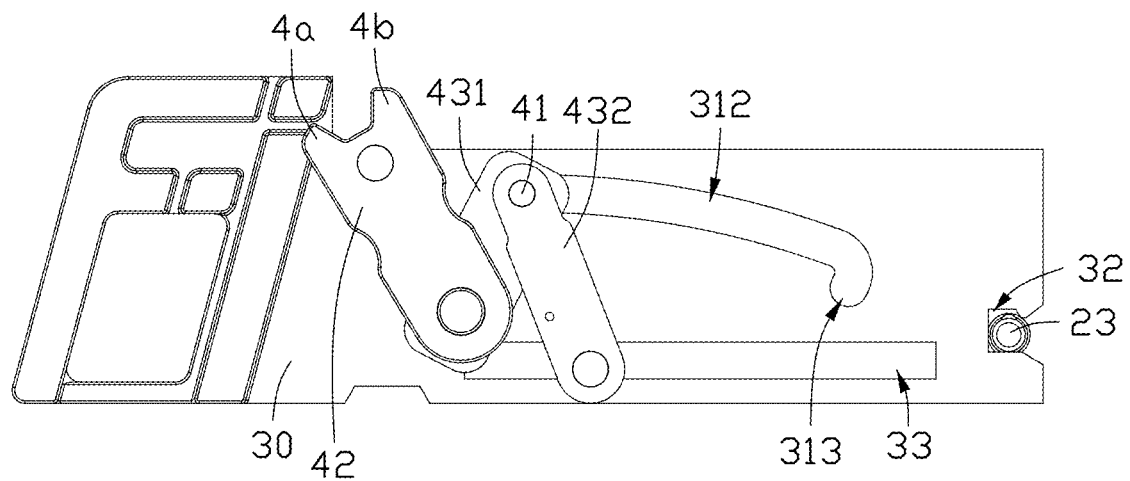
FIG. 3 is a side view of the locking device removed the blocking element shown in FIG. 2.

As shown in FIG. 3, the link module 43 includes a first link member 431 and a second link member 432. One end of the first link member 431 is rotationally connected to the locking element 42, and the other end of the first link member 431 is rotationally connected to the connection element 41. One end of the second link member 432 is rotationally connected to the connection element 41, and the other end of the second link member 432 is rotationally installed on the second part 22. The first link member 431 is used to increase the rotation angle of the locking element 42, so that the locking element 42 cooperates with the blocking element 10. The second link member 432 limits the activity of the operating element 30 to a certain range by limiting the movement range of the connection element 41.

As shown in FIG. 3, the chute 31 includes a first groove section 312. The first groove section 312 is defined to tilt relative to the movement direction of the operating element 30. The connection element 41 slides along the first groove section 312, causing the link module 43 to drive the locking element 42 to rotate when the operating element 30 moves.

In an embodiment, the first groove section 312 is tilted downwards to rotate the locking component 40 on the fixing element 20 when the operation element 30 moves along the movement direction of operation element 30 towards blocking element 10.

In an embodiment, the first groove section 312 is a straight groove segment, while in another embodiment, the first groove section 312 is an arc groove segment.

As shown in FIG. 3, in an embodiment, the chute 31 further includes a second groove section 313. The second groove section 313 is connected to the first groove section 312 and is close to the back end of the operating element 30. The second groove section 313 is used to restrict the movement of the locking component 40. The second groove section 313 bends towards a side of the first groove section 312, and the side wall of the second groove section 313 stops the locking component 40 in the direction of detachment. When the connection element 41 moves along the first groove section 312 and is located within the second groove section 313, the side wall of the second groove section 313 blocks the connection element 41 to prevent the operation element 30 from moving towards the fitting element 20.

Figure 5:
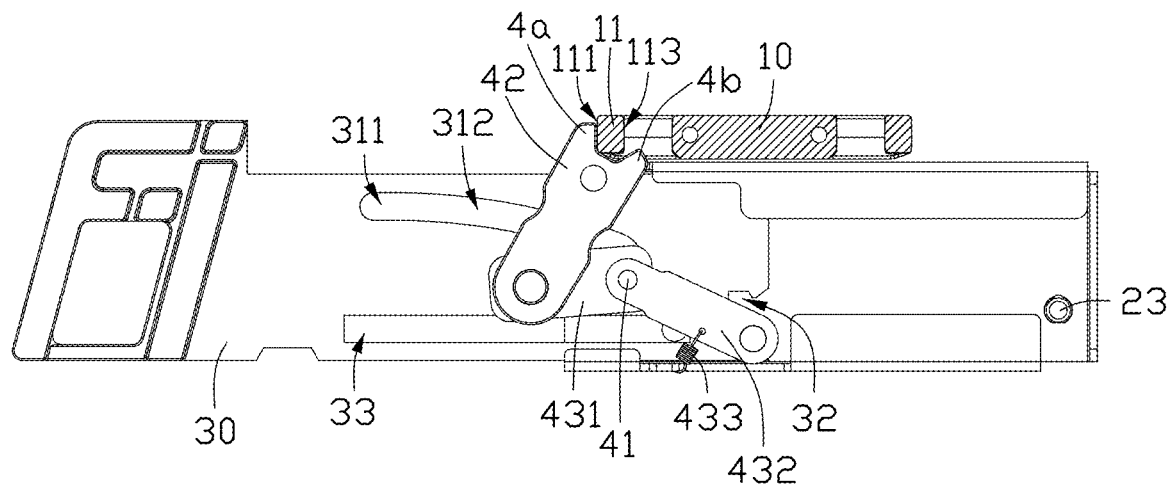
FIG. 5 is a side view of the locking device when it comes into contact with the operating element and the blocking element.

When the second component 300 is installed on the first component 200, the operating element 30 is forced to move towards the outside of the fixing element 20 until the connection element 41 is located in the second groove section 313, preventing the operating element 30 from moving towards the inside of the fixing element 20. At the same time, the operating element 30, the fitting element 20, and the locking component 40 are relatively stationary. Next, apply force to the operating element 30 to move the operating element 30, the fixing element 20, and the locking component 40 towards the blocking element 10 until the locking element 42 contacts the blocking element 10, as shown in FIG. 5. The locking element 42 rotates under the continued movement of the operating element 30 and the action of the blocking element 10 until the locking element 42 is locked with the blocking element 10.

As shown in FIGS. 2 and 3, the chute 31 further includes a third groove section 311. The third groove section 311 is connected to the first groove section 312. The third groove section 311 is located near the front end of the operating element 30. The first groove section 312 is located between the third groove section 311 and the second groove section 313. When the connection element 41 moves along the third groove section 311 of the operating element 30, the locking component 40 remains stationary relative to the fixing element 20.

In an embodiment, the third groove section 311 is a straight groove segment and extends along the straight line parallel to the movement direction of the operating element 30. When the connection element 41 is located within the third groove section 311 and moves along the third groove section 311, the fixing element 20 and the locking component 40 are relatively stationary and simultaneously moving relative to the operating element 30. At this time, the operating element 30 could not drive the locking component 40 to rotate.

In an embodiment, the first groove section 312 is longer than the third groove section 311 and the second groove section 313, and the first groove section 312 occupies the main part of the chute 31. When moving the operation element 30, the connection element 41 mainly moves within the first groove section 312, ensuring that the labor-saving effect of the locking device 100 is basically consistent throughout the installation process, avoiding excessive changes in the speed of the operation element 30 movement due to inconsistent labor-saving effects, thereby improving the smoothness of the pulling operation element 30.

Figure 4:
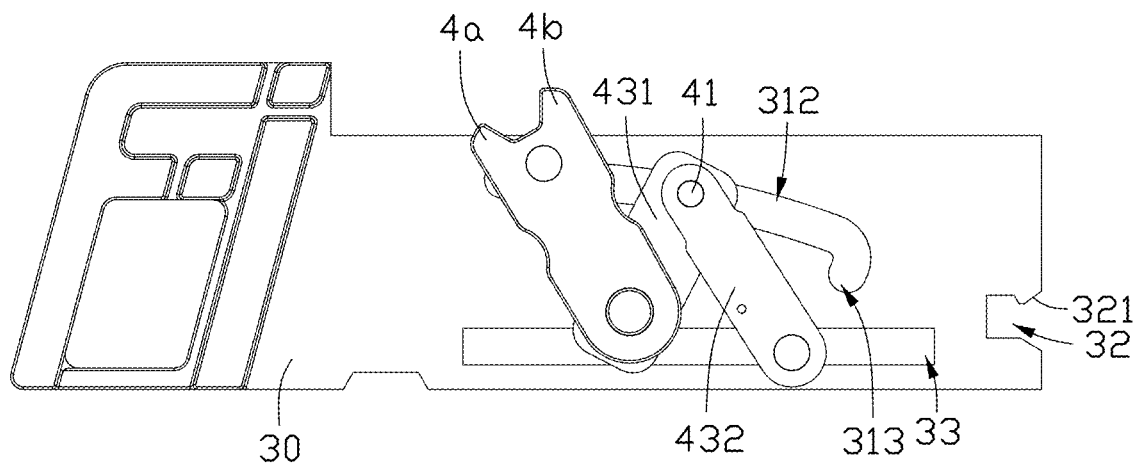
FIG. 4 is similar to FIG. 3, but showing the locking device in FIG. 3 during the operation element movement process.

As shown in FIG. 4, in an embodiment, the locking element 42 includes a first bump 4a and a second bump 4b. There is a gap between the first bump 4a and the second bump 4b.

As shown in FIGS. 1 and 2, a blocking port 11 is defined in the blocking element 10. The blocking port 11 is located at one end of the blocking element 10. The blocking port 11 provides a first surface 111 and a second surface 113 on opposite sides. Along the direction of the operating element 30 towards the blocking element 10, the first bump 4a and the second bump 4b are set alternately, and the first surface 111 and the second surface 113 are set sequentially.

The operating element 30 moves towards the blocking element 10, and after the first bump 4a contacts the first surface 111, the locking element 42 continues to rotate driven by the movement of the operating element 30. When the second bump 4b contacts the second surface 113 and the connection element 41 moves to the third groove section 311, the locking element 42 stops rotating and locks with the blocking element 10, securing the first component 200 in the second component 300.

When the operating element 30 is moved away from the blocking element 10, the second bump 4b contacts the second surface 113, and the locking element 42 continues to rotate until the second bump 4b disengages from the second surface 113. Next, the locking element 42 continues to rotate until the first bump 4a contacts the first surface 111, and the connection element 41 moves to the third groove section 311. The operating element 30, the fixing element 20, and the locking component 40 are relatively stationary. Continue to move away from blocking element 10 by operating element 30, separating first component 200 from second component 300. Keep the operating element 30 away from the blocking element 10, separating the first component 200 from the second component 300.

As shown in FIGS. 2 and 3, the fixing element 20 further includes a limiting part 23. The limiting part 23 is set at the first part 21 and is close to the back end of the first part 21. The limiting part 23 is configured to restrict the movement of the operating element 30 to make it fixed relative to the first part 21.

As shown in FIGS. 2 and 3, a limiting groove 32 is defined on the operating element 30. The combination of limiting groove 32 and limiting part 23 limits the movement of the operating element 30.

In an embodiment, the limiting groove 32 is located at the back end of the operating element 30. The limiting groove 32 is formed by the back end of the operating element 30 facing the center depression of the operating element 30. When the connection element 41 is located within the second groove section 313, the limiting part 23 is buckled into the limiting groove 32.

As shown in FIG. 2, in an embodiment, the operating element 30 provides a bulge 321 protrudes into the limiting groove 32. The limiting part 23 crosses over the bulge 321 and enters the limiting groove 32. The bulge 321 limits the limiting part 23 to the limiting groove 32, making the operating element 30 stationary relative to the fitting element 20, thereby preventing the operating element 30 from sliding out of the fitting element 20. Applying tension to the operating element 30, causing the limiting part 23 to cross the bulge 321 and detach from the limiting groove 32.

In an embodiment, the limiting part 23 is a circular cylinder, and the limiting part 23 is made of elastic rubber.

In another embodiment, the limiting part 23 is in other shapes such as a square and made of other elastic materials, and the limiting part 23 limits the operating element 30 to be fixed relative to the fixing element 20.

As shown in FIGS. 2 and 3, the fixing element 20 provides a guiding part 24. The guiding part 24 is connected to the first part 21 to provide guidance for the operating element 30 during its movement. A guide groove 33 is defined on the operating element 30. The guide groove 33 is set along the direction of movement of the operating element 30. The guiding part 24 moves within the guide groove 33 to avoid detachment between operating element 30 and fixing element 20.

In another embodiment, the number of guiding parts 24 is two. Two guiding parts 24 guide the operation element 30 to keep roughly moving in a straight direction and avoid shaking on the first part 21.

In an embodiment, the guiding part 24 is a circular guide column.

In another embodiment, the number of the guiding parts 24 is one or more, and the guiding parts 24 has other shapes such as squares.

The number of guide grooves 33 corresponds to the number of guiding parts 24. In an embodiment, the number of guide grooves 33 is one, and in another embodiment, the number of guide grooves 33 is other. For example, the number of guide grooves 33 is two, and the two guide grooves 33 are set in parallel to keep the operating element 30 moving in a straight direction.

In an embodiment, the guide groove 33 is in transitional coordination with the guiding part 24 to avoid collisions between the guide groove 33 and the guiding part 24, thereby avoiding the operation element 30 shaking on the guiding part 24 and ensuring stable installation of the operation element 30 on the fixing element 20.

In another embodiment, the guide groove 33 is defined on fixing element 20, and guiding part 24 is arranged on operating element 30.

As shown in FIG. 2, in an embodiment, the fixing element 20 further includes a protective board 25. The protective board 25, the guiding part 24, and the limiting part 23 are located on the same side of the first part 21. The protective board 25 is configured to protect the operating element 30.

The operating element 30 is located between the protective board 25 and first part 21 to prevent the operating element 30 from leaning towards the second part 22 during the activity process, thereby avoiding collision between the operating element 30 and the locking component 40 installed on the second part 22.

In an embodiment, as shown in FIG. 5, the link module 43 further includes a holding member 433. One end the holding member 433 is connected to the second link member 432, and the other end of the holding member 433 is connected to the fixing element 20. The holding member 433 applies force to the second link member 432 to limit the connection element 41 within the second groove section 313, avoiding the connection element 41 detachment from the second groove section 313 due to shaking or vibration of the locking device 100.

As shown in FIG. 5, when the connection element 41 is located in the second groove section 313, the holding member 433 pulls down the second link member 432. The second link member 432 shows a counterclockwise rotation trend. There is a trend of downward movement in the connection element 41, as well as a trend of movement towards the direction of deepening into the second groove section 313, which limits the connection element 41 to be within the second groove section 313.

In an embodiment, the holding member 433 is a spring. In another embodiment, the holding member 433 is other elastic structure such as elastic rope.

Figure 7:
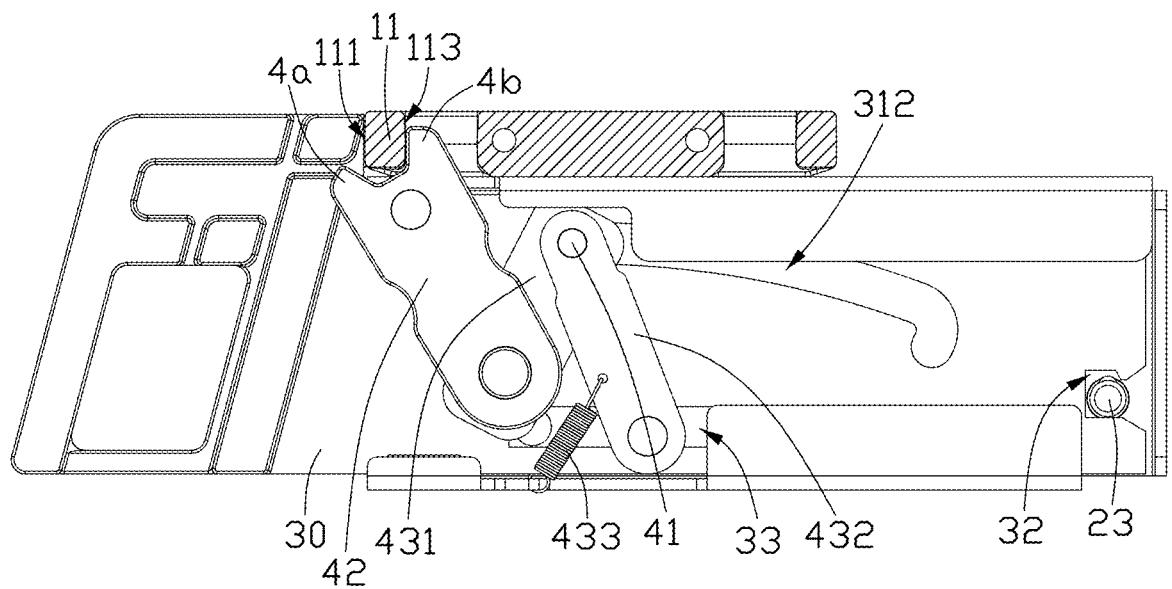
FIG. 7 is similar to FIG. 6, but showing the locking device upon installation completion.

As shown in FIG. 5, when the operating element 30 moves inside the fixing element 20, the locking element 42 starts rotating counterclockwise after the first bump 4a contacts the blocking element 10, and the first link member 431 rotates counterclockwise under the drive of the locking element 42. The first link member 431 rotating counterclockwise will drive the connection element 41 to gradually move upwards, causing the connection element 41 to gradually move out of the second groove section 313, achieving a quick release of the restriction on the connection element 41 by the second groove section 313. As shown in FIG. 7, when the second bump 4b of the locking element 42 contacts the second surface 113, the first link member 431 and the second link member 432 are in a nearly folded state and form a small angle to reduce the size of the link module 43.

As shown in FIG. 5, when the second bump 4b of the locking element 42 detaches from the second surface 113, and the first bump 4a contacts the first surface 111, the first link member 431 and the second link member 432 are in an approximately extended state and form a large angle, increasing the rotation angle of the locking element 42 and avoiding collision between the second bump 4b of the locking element 42 and the blocking element 10.

The operating element 30 drives the connection element 41, as well as the link module 43 and locking element 42 to move, to separate the locking element 42 from the blocking element 10, thereby lifting the restriction of the blocking element 10 on the locking element 42. The second component 300 is extracted from the first component 200.

When pushing the second component 300 into the first component 200, the locking element 42 rotates under the obstruction of the blocking element 10, which drives the link module 43 and the connection element 41 to move, causing the connection element 41 to detach from the second groove section 313, thereby removing the restriction of the second groove section 313 on the connection element 41 and achieving the operation of the operating element 30.

When separating the second component 300 from the first component 200, the specific process is as follows:

As shown in FIG. 3, When the installation is completed, the connection element 41 is located in the third groove section 311, the limiting part 23 is buckled into the limiting groove 32, and the locking element 42 and the link module 43 are stationary relative to fixing element 20.

As shown in FIG. 4, pull the operating element 30. The connection element 41 departs from the third groove section 311 and enters the first groove section 312. The limiting part 23 departs from the limiting groove 32. The tilt setting of the first groove section 312 causes the locking element 42 to rotate clockwise as the connection element 41 moves along the first groove section 312, and the second bump 4b gradually disengages from the second surface 113 of the blocking element 10.

As shown in FIG. 5, continuing to pull on the operating element 30, the connection element 41 enters the second groove section 313. The connection element 41 is restricted within the second groove section 313, making it impossible for the operating element 30 to be pulled out of the fitting element 20 or pushed into the fitting element 20. The second bump 4b completely disengages from the second surface 113, which means lifting the restriction of the blocking element 10 on the fixing element 20 and implementing the detachment of the second component 300 from the first component 200.

The side walls of the second groove section 313 are circular, and when locking element 42 and the link module 43 do not drive the connection element 41, the side walls of the second groove section 313 will restrict the connection element 41 from detaching from the second groove section 313.

Figure 6:
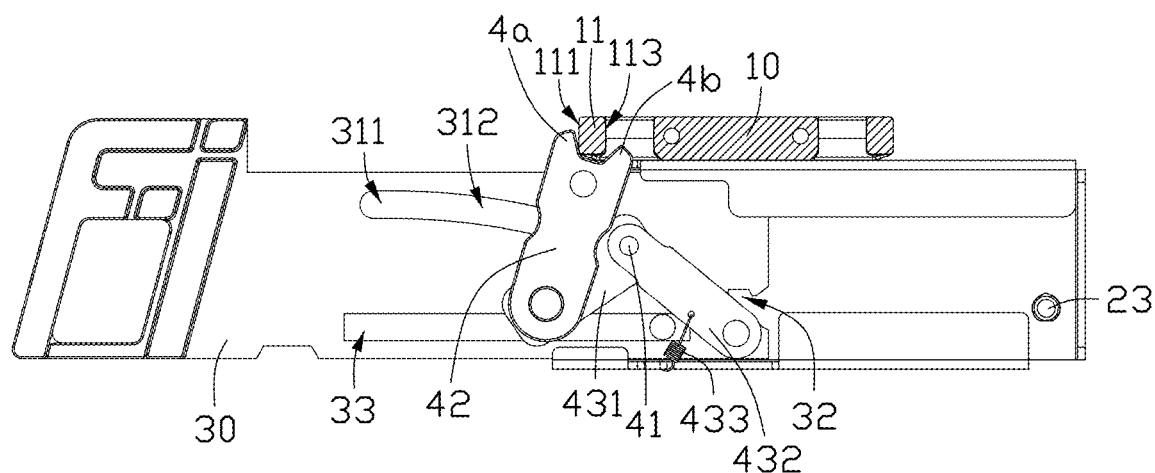
FIG. 6 is similar to FIG. 5, but showing the locking device when the operating element and blocking element are about to detach.

When locking the second component 300 to the first component 200, the specific process is as follows:

As shown in FIGS. 1 and 5, the first component 200 is placed on the second component 300 and pushed into the second component 300 through the operating element 30. After the first bump 4a contacts the blocking element 10, the locking element 42 begins to rotate counterclockwise, the connection element 41 starts to detach from the second groove section 313 under the action of the locking element 42, and the operating element 30 is pushed into the fixing element 20. As shown in FIG. 6, When the first bump 4a contacts the blocking port 11, the connection element 41 gradually disengages from the second groove section 313.

As shown in FIG. 7, continue to push the operation element 30, and the connection element 41 moves forward relative to the first groove section 312 until entering the third groove section 311. The second bump 4b contacts the blocking port 11, and the operation element 30 is limited to the fixing element 20 through the combination of the limiting part 23 and the limiting groove 32, while the first component 200 and the second component 300 are installed.

Figure 8:
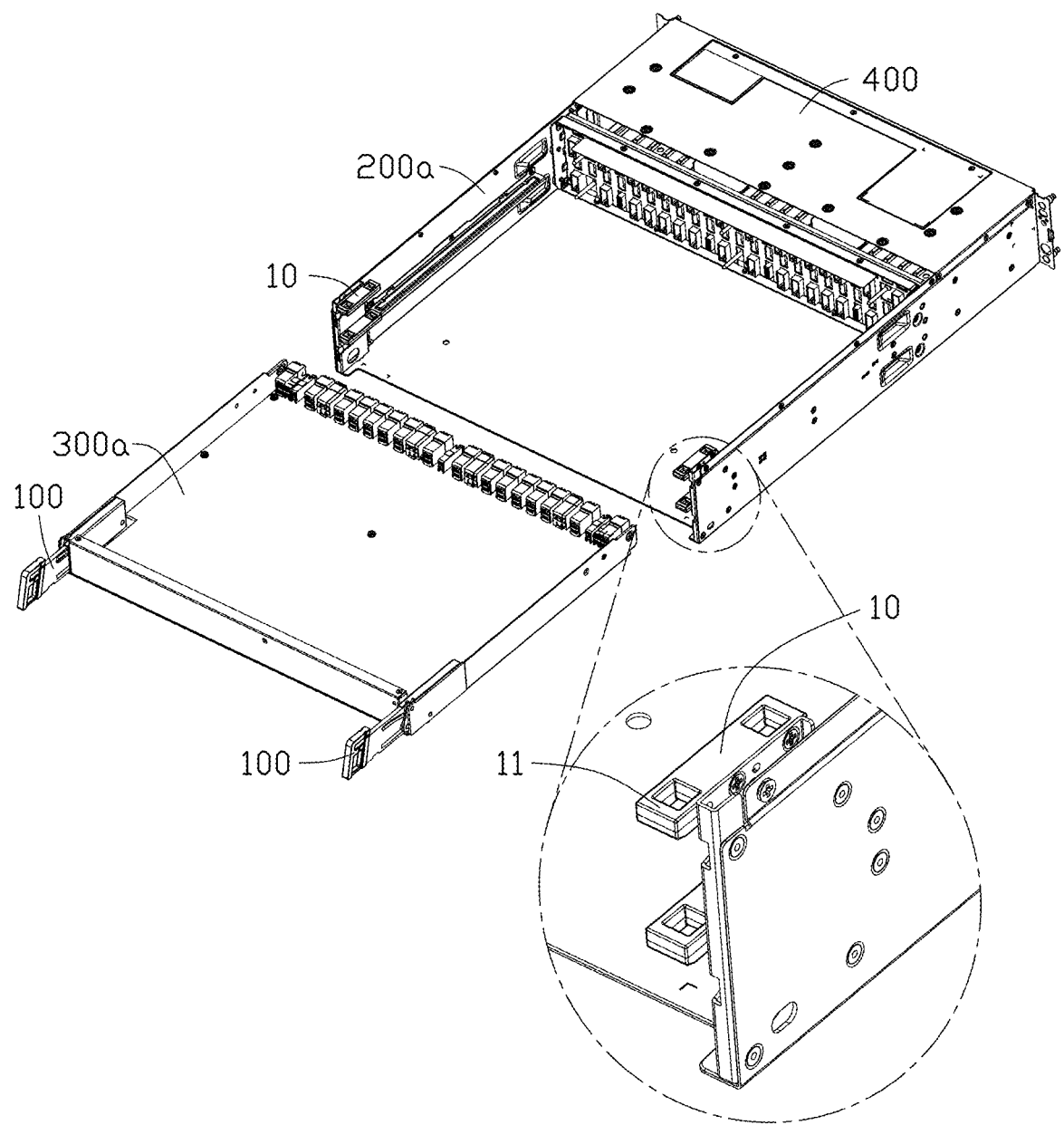
FIG. 8 is an isometric, exploded view of a chassis, showing the first component being removed from the second component.

As shown in FIG. 8, an embodiment of the present application further provides a chassis 1. The chassis 1 includes memory module 300a, casing 200a, and the locking device 100. The blocking element 10 is arranged on the casing 200a, and the fixing element 20 is set on the memory module 300a. The casing 200a and the memory module 300a are detachably connected through the locking device 100.

When a hard disk module 400 is fixed within the casing 200a, the memory module 300a is in a locked state and combines with the hard disk module 400.

When the hard disk module 400 is disassembled outside of the casing 200a, the memory module 300a is unlocked and separated from the hard disk module 400.

In an embodiment, the locking device 100 is set at the front end of the memory module 300a, the blocking element 10 is set at the front end of the casing 200aAfter installing the memory module 300a into the casing 200a through the locking device 100, the locking device 100 is located on the front end of the casing 200a. The memory module 300a is fixed within the casing 200a through the locking device 100, and is combined with the hard disk module 400.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A locking device configured for installing a second component to a first component, the locking device comprising:
a blocking element configured to be installed on the first component;
a fixing element configured to be installed on the second component;
an operating element movably arranged on the fixing element, and defining a chute; and
a locking component, wherein
the locking component comprises:
a connection element movably engaged in the chute;
a locking element rotationally arranged at the fixing element; and
a link module, comprising at least two connected connecting link members, one end of the link module is rotationally connected to the fixing element, while another end is rotationally connected to the locking element, and a portion between the two ends of the link module is rotationally connected to the connection element;
the operating element is drove to move the connection element in the chute, and to rotate the connected connecting link members of the link module to drive the locking element to lock or detach from the blocking element.

2. The locking device of claim 1, wherein:
the chute has a first groove section that is tilted relative to a movement direction of the operating element.

3. The locking device of claim 2, wherein:
the locking element is equipped with a first bump and a second bump at an end, and the blocking element is equipped with a blocking port;
one side of the blocking port is equipped with a first surface, and another side is equipped with a second surface;
the first bump and the second bump are arranged in intervals, and the first surface and the second surface are arranged in sequence along the movement direction of the operating element moving towards the blocking element;
when the operating element moves towards the blocking element and the first bump contacts the first surface, the locking element rotates until the second bump contacts the second surface;
when the operating element moves away from the blocking element, the second bump detaches from the second surface, and the locking element rotates until the first bump contacts the first surface.

4. The locking device of claim 2, wherein:
the chute further comprises a third groove section, which extends in a direction parallel to a movement of the operating element;
the third groove section and the first groove section are connected and arranged sequentially along the movement direction in which the operating element moves towards the blocking element.

5. The locking device of claim 2, wherein:
the chute further comprises a second groove section, which is connected to the first groove section; the first groove section and the second groove section are connected and arranged sequentially along the movement direction in which the operating element moves towards the blocking element;
the second groove section extends to one side of the first groove section;
when the locking element is locked with the blocking element, the connection element is moved into the second groove section.

6. The locking device of claim 5, wherein:
a groove wall of the second groove section is equipped with an arc surface, which is modeled after an outer wall of the connection element and adheres to the outer wall of the connection element.

7. The locking device of claim 1, wherein:
the at least the two connected connecting link members of the link module comprise:
a first link member rotationally connected between the locking element and the connection element;
a second link member rotationally connected between the fixing element and the connection element.

8. The locking device of claim 7, wherein:
the link module further comprises a holding member, which is connected to the fixing element and the second link member, and generates an elastic moment on the second link member to limit its rotation.

9. The locking device of claim 1, wherein:
the fixing element comprises a limiting part, and an end of the operating element is defined with a limiting groove;
when the locking element is locked with the blocking element, the limiting part is buckled into the limiting groove.

10. The locking device of claim 1, wherein:
the fixing element has a guiding part, and a guide groove is defined on the operating element, the guide groove extends in a movement direction of the operation element;
the guiding part is sliding inside the guide groove to prevent the operation element from detaching from the fixing element.

11. A locking device for installing a second component into a first component, the locking device comprising:
a blocking element configured to be installed on the first component;
a fixing element configured to be installed on the second component;
an operating element movably arranged on the fixing element, and defining a chute; and
a locking component, wherein
the chute comprises a third groove section, the locking component comprises:
a connection element movably connected within the chute;
a locking element rotationally arranged at the fixing element; and
a link module which comprises:
a first link member rotatably connected to the locking element and the connection element;
a second link member rotatably connected to the fixing element and the connection element; and
a holding member connected to the fixing element and the second link member to generate elastic torque on the second link member and achieve positioning of the connection element in the third groove section; and
the operating element is subjected to force to move the connection element within the chute, and to rotate the first and second link member of the link module and drive the locking element to lock or detach from the blocking element.

12. A chassis comprising:
a casing;
a memory module; and
a locking device, wherein:
the locking device comprises:
a blocking element configured to be installed on the casing;
a fixing element configured to be installed on the memory module;
an operating element movably arranged on the fixing element, and defining a chute; and
a locking component comprising:
a connection element movably connected within the chute;
a locking element rotationally arranged at the fixing element; and
a link module, comprising at least two connected connecting link members, one end of the link module is rotationally connected to the fixing element, while another end is rotationally connected to the locking element, and a portion between the two ends of the link module is rotationally connected to the connection element;
the operating element is subjected to force to move the connection element within the chute, and to rotate the link member of the link module and drive the locking element to lock or detach from the blocking element;
the fixing element is arranged on the memory module, the blocking element is arranged on the casing, and the memory module is detachably installed in the casing through the locking device.

13. The chassis of claim 12, wherein:
the chute has a first groove section that is tilted relative to a movement direction of the operating element.

14. The chassis of claim 13, wherein:
the locking element is equipped with a first bump and a second bump at an end, and the blocking element is equipped with a blocking port;
one side of the blocking port is equipped with a first surface, and another side is equipped with a second surface;
the first bump and the second bump are arranged in intervals, and the first surface and the second surface are arranged in sequence along the movement direction of the operating element moving towards the blocking element;
when the operating element moves towards the blocking element and the first bump contacts the first surface, the locking element rotates until the second bump contacts the second surface;
when the operating element moves away from the blocking element, the second bump detaches from the second surface, and the locking element rotates until the first bump contacts the first surface.

15. The chassis of claim 13, wherein:
the chute further comprises a third groove section, which extends in a direction parallel to a movement of the operating element;
the third groove section and the first groove section are connected and arranged sequentially along the movement direction in which the operating element moves towards the blocking element.

16. The chassis of claim 13, wherein:
the chute further comprises a second groove section, which is connected to the first groove section; the first groove section and the second groove section are connected and arranged sequentially along the movement direction in which the operating element moves towards the blocking element;
the second groove section extends to one side of the first groove section;
when the locking element is locked with the blocking element, the connection element is moved into the second groove section.

17. The chassis of claim 16, wherein:
a groove wall of the second groove section is equipped with an arc surface, which is modeled after an outer wall of the connection element and adheres to the outer wall of the connection element.

18. The chassis of claim 12, wherein:
the at least the two connected connecting link members of the link module comprise:
a first link member rotationally connected between the locking element and the connection element;
a second link member rotationally connected between the fixing element and the connection element.

19. The chassis of claim 18, wherein:
the link module further comprises a holding member, which is connected to the fixing element and the second link member, and generates an elastic moment on the second link member to limit its rotation.

20. The chassis of claim 12, wherein:
the fixing element comprises a limiting part, and an end of the operating element is defined with a limiting groove;
when the locking element is locked with the blocking element, the limiting part is buckled into the limiting groove.

* * * * *